United States Patent
Sun et al.

(10) Patent No.: US 10,490,511 B2
(45) Date of Patent: Nov. 26, 2019

(54) MICROELECTRONIC ASSEMBLY WITH ELECTROMAGNETIC SHIELDING

(71) Applicant: MEDIATEK INC., Hsin-Chu (TW)

(72) Inventors: Ruey-Bo Sun, Taipei (TW); Wen-Chou Wu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/973,541

(22) Filed: May 8, 2018

(65) Prior Publication Data

US 2018/0350751 A1 Dec. 6, 2018

Related U.S. Application Data

(60) Provisional application No. 62/513,496, filed on Jun. 1, 2017.

(51) Int. Cl.
| | |
|---|---|
| H01L 25/18 | (2006.01) |
| H01L 23/552 | (2006.01) |
| H01L 23/66 | (2006.01) |
| H05K 1/02 | (2006.01) |
| H05K 7/20 | (2006.01) |
| H05K 9/00 | (2006.01) |
| H01L 23/06 | (2006.01) |
| H01L 23/373 | (2006.01) |
| H01L 23/64 | (2006.01) |

(Continued)

(52) U.S. Cl.
CPC ............ *H01L 23/552* (2013.01); *H01L 23/06* (2013.01); *H01L 23/373* (2013.01); *H01L 23/645* (2013.01); *H01L 23/66* (2013.01); *H01L 25/0655* (2013.01); *H05K 1/0203* (2013.01); *H05K 1/0216* (2013.01); *H05K 7/20454* (2013.01); *H05K 9/0032* (2013.01); *H01L 24/16* (2013.01); *H01L 2224/16225* (2013.01); *H05K 1/0215* (2013.01); *H05K 2201/09972* (2013.01); *H05K 2201/1056* (2013.01); *H05K 2201/10371* (2013.01)

(58) Field of Classification Search
CPC . H01L 23/552; H01L 25/0655; H05K 9/0032; H05K 1/0216; H05K 2201/1056; H05K 2201/10371
See application file for complete search history.

(56) References Cited

U.S. PATENT DOCUMENTS

| | | | |
|---|---|---|---|
| 9,633,158 B1 | 4/2017 | Jones | |
| 2002/0074549 A1* | 6/2002 | Park | G02F 1/13458 257/59 |

(Continued)

FOREIGN PATENT DOCUMENTS

| | | |
|---|---|---|
| EP | 2 584 605 A2 | 4/2013 |
| WO | 2015/096135 A1 | 7/2015 |

*Primary Examiner* — Kyoung Lee
*Assistant Examiner* — Christina A Sylvia
(74) *Attorney, Agent, or Firm* — Winston Hsu

(57) ABSTRACT

A microelectronic assembly includes a substrate and a first microelectronic component mounted on the substrate. The first microelectronic component includes a digital/analog IP block and a RF IP block. A shielding case is mounted on the substrate. The shielding case includes a plurality of sidewalls, one intermediate wall, and a lid. A thermal interface material (TIM) layer is situated between the lid and the first microelectronic component. A noise suppressing structure is interposed between the TIM layer and the first microelectronic component.

21 Claims, 4 Drawing Sheets

(51) Int. Cl.
*H01L 25/065* (2006.01)
*H01L 23/00* (2006.01)

(56) References Cited

U.S. PATENT DOCUMENTS

| | | | |
|---|---|---|---|
| 2004/0099878 A1* | 5/2004 | Huang | H01L 21/761 |
| | | | 257/170 |
| 2005/0077596 A1 | 4/2005 | Bauer | |
| 2010/0323634 A1* | 12/2010 | Kimura | H04B 1/40 |
| | | | 455/68 |
| 2012/0025356 A1 | 2/2012 | Liao | |
| 2014/0160699 A1 | 6/2014 | Zhang | |
| 2016/0216752 A1* | 7/2016 | Kim | G06F 1/329 |
| 2016/0268248 A1* | 9/2016 | Fan | H01L 27/0255 |
| 2017/0092634 A1* | 3/2017 | Yu | H01L 25/18 |
| 2019/0006291 A1* | 1/2019 | Neal | H01L 21/565 |
| 2019/0082536 A1* | 3/2019 | Park | G06F 1/1626 |

\* cited by examiner

MICROELECTRONIC ASSEMBLY WITH ELECTROMAGNETIC SHIELDING

CROSS REFERENCE TO RELATED APPLICATIONS

This application claims priorities from U.S. provisional application No. 62/513,496 filed Jun. 1, 2017, which is included herein in its entirety by reference.

BACKGROUND

This disclosure generally relates to the field of electronic devices, and more particularly to a microelectronic assembly with electromagnetic shielding and a noise suppressing structure.

As known in the art, desense is a degradation of the sensitivity of the receiver due to external noise sources. Receiver sensitivity may be suddenly compromised when other components like the memory interfaces become active.

It is known that high-speed signals like memory buses or display channels may send electrical pulses over transmission lines. An ideal transmission line by itself keeps this energy in its own structure. However, discontinuities like a connector or imperfect flex line allow some of this energy to be radiated into the surrounding to act as a noise source. In the time of smart phones and automotive infotainment, mobile memory data rates have entered the multi-gigahertz range, directly interfering with the frequency band used for wireless communication.

The desense problem has become particularly troublesome for today's wireless technologies. Therefore, there is a need in this industry to provide an improved microelectronic assembly with electromagnetic shielding that is capable of solving the prior art prior art problems and shortcomings.

SUMMARY

It is an objective of the claimed invention to provide an improved microelectronic assembly with electromagnetic shielding and a noise suppressing structure, which is cost-effective and is capable of solving the desense problem.

According to one aspect of the invention, a microelectronic assembly is provided. The microelectronic assembly comprises a substrate, a first microelectronic component and a second microelectronic component mounted on the substrate, and a shielding case mounted on the substrate. The first microelectronic component comprises a digital/analog IP block and a RF IP block. The first microelectronic component and the second microelectronic component are mounted on the substrate in a side-by-side manner. The shielding case comprises a plurality of sidewalls, one intermediate wall, and a lid. The first microelectronic component and the second microelectronic component are disposed in two separated compartments respectively within the shielding case. The intermediate wall is interposed between the first microelectronic component and the second microelectronic component. A thermal interface material (TIM) layer is situated between the lid and the first microelectronic component. A noise suppressing structure is interposed between the TIM layer and the first microelectronic component.

According to one embodiment of the invention, a microelectronic assembly comprises a substrate, a first microelectronic component mounted on the substrate, a second microelectronic component mounted on the substrate, and a shielding case mounted on the substrate. The first microelectronic component comprises a digital/analog IP block and a RF IP block. The first microelectronic component and the second microelectronic component are mounted on the substrate in a side-by-side manner. The shielding case comprises a plurality of sidewalls and a lid. The first microelectronic component and the second microelectronic component are disposed in two separated compartments respectively within the shielding case. A thermal interface material (TIM) layer is situated between the lid and the first microelectronic component. A noise suppressing structure is interposed between the TIM layer and the first microelectronic component, wherein the noise suppressing structure is electrically connected to a ground plane of the substrate through soldering or a conductive pad.

According to another embodiment of the invention, a microelectronic assembly comprises a substrate, a first microelectronic component mounted on the substrate, a second microelectronic component mounted on the substrate, and a shielding case mounted on the substrate. The first microelectronic component comprises a digital/analog IP block and a RF IP block. The first microelectronic component and the second microelectronic component are mounted on the substrate in a side-by-side manner. The shielding case comprises a plurality of sidewalls and a lid. The first microelectronic component and the second microelectronic component are disposed in two separated compartments respectively within the shielding case. A noise suppressing structure disposed directly on the first microelectronic component. An air gap is provided between the noise suppressing structure and the lid.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

The present invention pertains to a microelectronic assembly incorporated with a noise suppressing structure, which is capable of eliminating the prior art desense problem at the board of component level. The proposed approach is inexpensive and is easy-to-assembly. The structure integration of the electromagnetic interference (EMI) shielding cover or lid can be maintained such that the emitted radiation can be minimized so as to meet the various EMI standards such as Federal Communications Commission (FCC) rules. There is no need to form any slots, apertures, trenches or openings in the EMI shielding cover or lid. Further, the incorporation of the noise suppressing structure does not reduce the heat dissipating efficiency of the microelectronic assembly.

Figure 1:
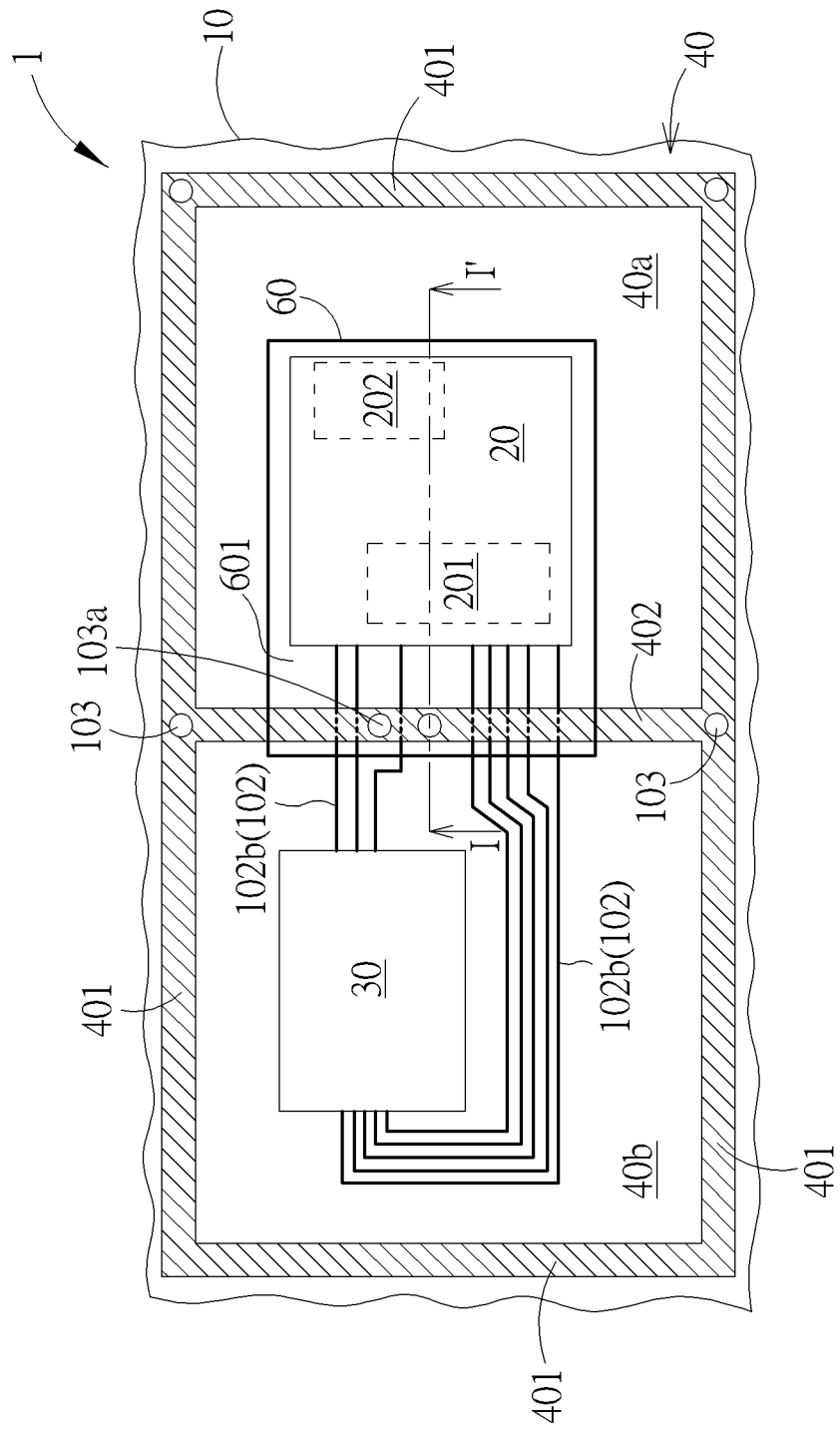
FIG. 1 is a schematic top perspective view of a microelectronic assembly with electromagnetic shielding according to one embodiment of the invention.
Figure 2:
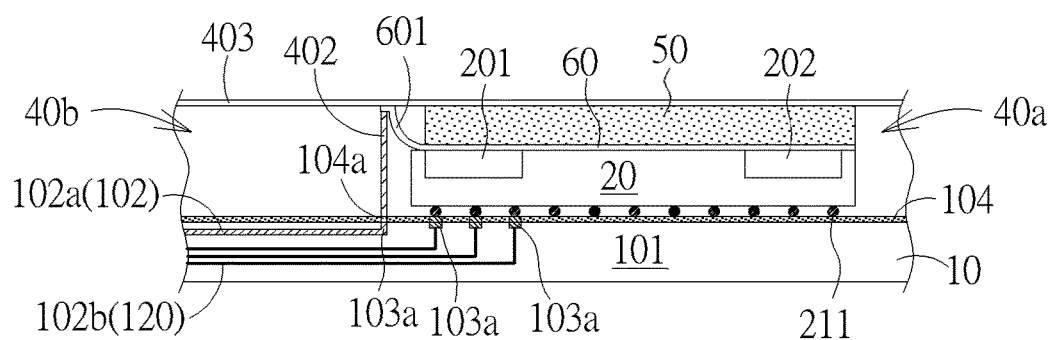
FIG. 2 is a schematic, cross-sectional view of the microelectronic assembly with electromagnetic shielding taken along line I-I' in FIG. 1.
Figure 3:
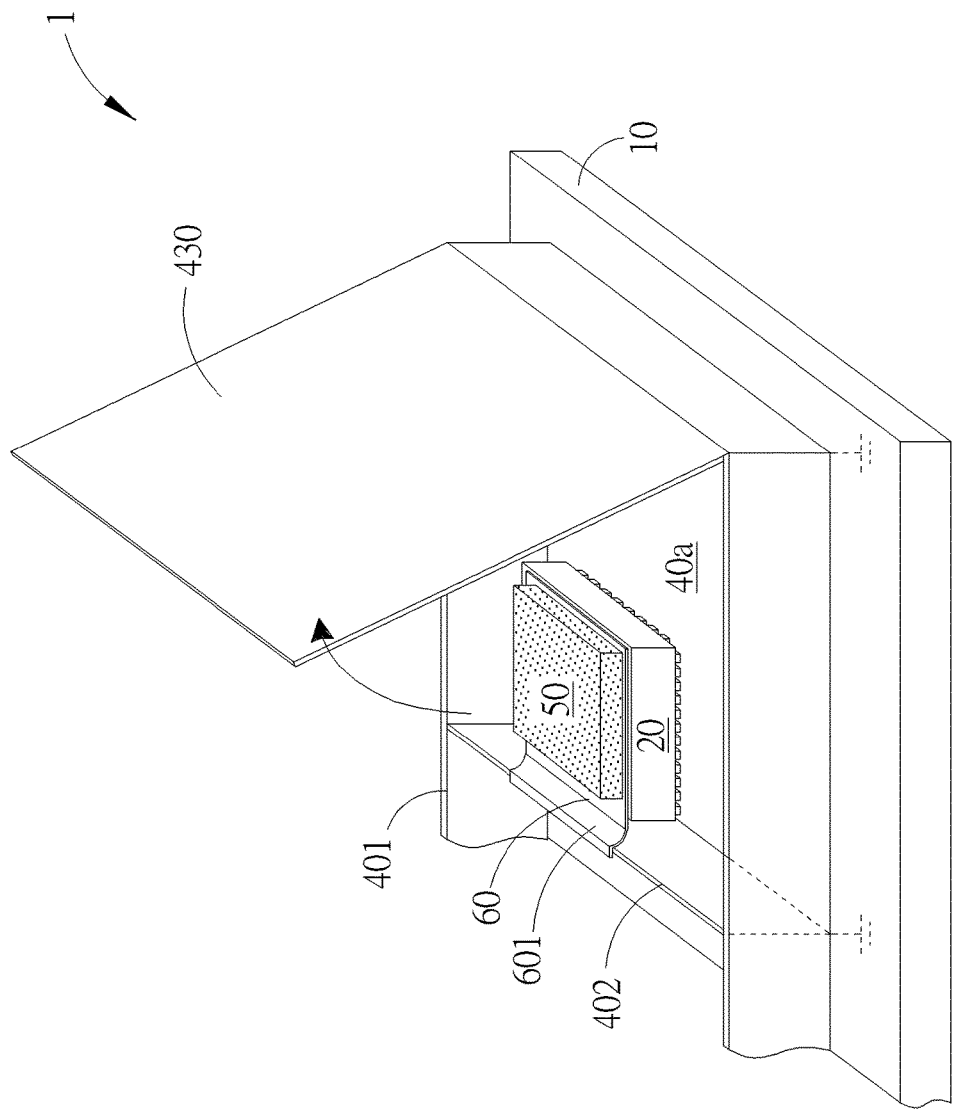
FIG. 3 is a perspective view of the microelectronic assembly with electromagnetic shielding according to one embodiment of the invention.

Please refer to FIG. 1 to FIG. 3. FIG. 1 is a schematic top perspective view of a microelectronic assembly with electromagnetic shielding according to one embodiment of the invention. FIG. 2 is a schematic, cross-sectional view of the microelectronic assembly with electromagnetic shielding taken along line I-I' in FIG. 1. FIG. is a perspective view of the microelectronic assembly with electromagnetic shielding according to one embodiment of the invention.

As shown in FIG. 1 to FIG. 3, a microelectronic assembly 1 comprises a substrate 10 such as a printed circuit board (PCB), printed wiring board (PWB), or a mother board, but is not limited thereto. According to the illustrative embodiment, the substrate 10 comprises a ground conductor such as a ground plane, but is not limited thereto. The substrate 10 may comprise an insulating core 101 and multiple layers of traces or conductors 102 interconnected with vias or plated through holes. It is to be understood that the number of layers of conductors in the substrate is for illustration purposes only.

For example, the substrate 10 may be composed of bismaleimide triazine (BT) resin, FR-4 (a composite material composed of woven fiberglass cloth with an epoxy resin binder that is flame resistant), ceramic, glass, plastic, tape, film, or other supporting materials that may carry the traces 102 and conductive pads or lands 103 needed to receive conductive terminals. The topmost layer of the traces 102 may be covered with a solder mask or a solder resist 104. Solder mask openings 104a may be formed in the solder mask 104 to partially expose the conductive pads 103, respectively, for further connection.

According to the illustrative embodiment, the microelectronic assembly 1 further comprises a first microelectronic component 20 mounted on the substrate 10. According to the illustrative embodiment, the first microelectronic component 20 may be a semiconductor die package having at least one semiconductor integrated circuit die (not explicitly shown) encapsulated in an engineering molding compound, but is not limited thereto.

According to the illustrative embodiment, for example, the first microelectronic component 20 may be a RF SoC (System-on-Chip) or a RF System-in-Package (SiP), but is not limited thereto. According to embodiments of the invention, the first microelectronic component may comprise a central processing unit (CPU), a graphical processing unit (GPU), and/or a field-programmable gate array (FPGA), but is not limited thereto.

According to the illustrative embodiment, the first microelectronic component 20 may comprise a digital/analog IP block 201 and a RF IP block 202 within one single package. The digital/analog IP block 201 may produce noise or electromagnetic interference due to transient currents or voltages generated by clocks, transistors, or other switching logic elements in the first microelectronic component 20. According to the illustrative embodiment, the digital/analog IP block 201 may have various functions and may be the aggressor and the source of coupled noise. The digital/analog IP block 201 may interfere the RF IP block 202 and may cause the desense problem. The present invention addresses this issue.

According to the illustrative embodiment, the RF IP block 202 may have at least one RF path, which is the victim of noise coupling, and may comprise package and PCB-level routings between the die pads/bumps of the RF IP block 202 and an antenna through some passive PCB components including, but not limited to, inductors, capacitors, balun, diplexer, FBAR (film bulk acoustic resonator), etc.

According to the illustrative embodiment, as can be seen in FIG. 2, the first microelectronic component 20 may be mounted on the substrate 10 through a plurality of conductive terminals 211 such as bumps or solder balls, which are arranged at a bottom surface of the first microelectronic component 20. For example, the conductive terminals 211 may be a BGA array, but is not limited thereto.

According to the illustrative embodiment, the microelectronic assembly 1 further comprises a second microelectronic component 30 mounted on the substrate 10. According to the illustrative embodiment, the first microelectronic component 20 and the second microelectronic component 30 are mounted on the substrate 10 in a side-by-side manner. According to the illustrative embodiment, the second microelectronic component 30 may be a semiconductor die package having at least one semiconductor integrated circuit die (not explicitly shown) encapsulated in an engineering molding compound, but is not limited thereto.

According to the illustrative embodiment, for example, the second microelectronic component 30 may be an Ethernet circuit or a memory package such as DDR3 DRAM or DDR4 DRAM, but is not limited thereto. The second microelectronic component 30 may be electrically connected to the first microelectronic component 20 through the traces (e.g., high-speed buses) 102b in the substrate 10.

According to the illustrative embodiment, the microelectronic assembly 1 further comprises an EMI shielding case 40 mounted on the substrate 10. According to the illustrative embodiment, the EMI shielding case 40 comprises a plurality of sidewalls 401, e.g., four sidewalls, one intermediate wall 402, and a lid 403. However, in some other embodiments, the intermediate wall 402 could be omitted. The first microelectronic component 20 and the second microelectronic component 30 are disposed in two separated compartments 40a and 40b, respectively, within the EMI shielding case 40. The intermediate wall 402 is interposed between the first microelectronic component 20 and the second microelectronic component 30.

According to the illustrative embodiment, the intermediate wall 402 has a predetermined height that is higher than the thickness of the second microelectronic component 30 to provide adequate shielding. According to the illustrative embodiment, the plurality of sidewalls 401 and the intermediate wall 402 have substantially the same height.

According to the illustrative embodiment, the digital/analog IP block 201 of the first microelectronic component 20 is closer to the intermediate wall 402 than the RF IP block 202. The distance between the RF IP block 202 and the intermediate wall 402 is greater than the distance between the digital/analog IP block 201 and the intermediate wall 402.

According to the illustrative embodiment, the EMI shielding case 40 may be formed of a homogeneous material throughout, which means all parts (walls and lid) of the EMI shielding case 40 are formed of the same material. In an embodiment, the EMI shielding case 40 is a metal shielding case. For example, the EMI shielding case 40 may be made of copper (Cu) with a thin layer of nickel (Ni), although other metals or metal alloys such as aluminum or aluminum alloys may also be used. In another embodiment, an EMI absorbing material layer may be coated on the EMI shielding case 40.

According to the illustrative embodiment, the lid 403 completely covers the compartment where the first microelectronic component 20 is installed. According to the illustrative embodiment, no slot, aperture, trench or opening is formed in the lid 403 to keep the structural integration. The structure integration of the lid 403 can help to minimize the emission of radiation.

According to the illustrative embodiment, the EMI shielding case 40 is electrically connected to the ground plane 102a through the conductive pads 103 and soldering. It is noteworthy that some conductive pads 103a are disposed directly under the intermediate wall 402 to electrically connect the intermediate wall 402 to the ground plane 102a with solder or the like.

According to the illustrative embodiment, the microelectronic assembly 1 further comprises a thermal interface material (TIM) layer 50 situated between the lid 403 and the first microelectronic component 20. The TIM layer 50 has a high thermal conductivity and is in direct contact with the lid 403. For example, the TIM layer 50 may be made of silicones, which are polymers including, but not limited to, silicon, carbon, hydrogen, oxygen or other elements. The TIM layer 50 may comprise conductive materials, such as alumina ($Al_2O_3$) or zinc oxide ($ZnO_2$) mixed with silicone. According to the illustrative embodiment, the thickness of the TIM layer 50 may range between about 10 μm and about 300 μm, but is not limited thereto. The heat generated by the first microelectronic component 20 may be dissipated to the lid 403 through the TIM layer 50, and then to the external environment.

According to the illustrative embodiment, the microelectronic assembly 1 further comprises a noise suppressing structure 60 interposed between the TIM layer 50 and the first microelectronic component 20. According to the illustrative embodiment, the noise suppressing structure 60 is in direct contact with the first microelectronic component 20. According to the illustrative embodiment, the noise suppressing structure 60 may cover the entire top surface of the microelectronic component 20, and in such case, the TIM layer 50 is not in direct contact with the microelectronic component 20. According to another embodiment, the noise suppressing structure 60 may partially cover the top surface of the first microelectronic component 20, for example, the area overlapping the noisy digital/analog IP block 201, and in such case, the TIM layer 50 is in direct contact with the microelectronic component 20.

According to the illustrative embodiment, the noise suppressing structure 60 may be composed of a flexible or a foldable material capable of suppressing the noise generated by the noisy digital/analog IP block 201 and blocking the noise coupling through the TIM layer 50 and the lid 403. According to the illustrative embodiment, for example, the noise suppressing structure 60 may comprise conductive fabric, a copper foil, a metal film, or a copper-plated polyester cloth with an electrically conductive adhesive, but is not limited thereto. According to the illustrative embodiment, the noise suppressing structure 60 may be adhered to the top surface of the first microelectronic component 20.

According to the illustrative embodiment, the noise suppressing structure 60 comprises a connecting portion 601 with its distal end extended and adhered to the intermediate wall 402 such that the noise suppressing structure 60 is electrically coupled to the ground plane 102a of the substrate 10 through the connecting portion 601 and the intermediate wall 402 (a shorter noise suppression path). For example, the distal end of the connecting portion 601 may be adhered to a top surface of the intermediate wall 402, but is not limited thereto. According to various embodiments, the noise suppressing structure 60 may be electrically coupled to the on-chip and/or off-chip ground.

According to another embodiment, the shielding case 40 may be composed of a plurality of sidewalls and a lid. According to another embodiment, the intermediate wall 402 in FIG. 1 to FIG. 3 may be omitted as long as the connecting portion 601 of the noise suppressing structure 60 is electrically connected to a directly grounded part of the plurality of sidewalls of the shielding case 40, which is disposed closer to the noisy digital/analog IP block 201 and is disposed farther from the vulnerable RF IP block 202. The aforesaid directly grounded part of the sidewalls of the shielding case 40 is the part of the sidewalls of the shielding case 40 that is directly connected to the conductive pads 103a and is electrically connected to the ground plane 102a of the substrate 10 such that a shorter noise suppression path is established.

According to another embodiment, the connecting portion 601 of the noise suppressing structure 60 is directly connected to any conductive pads or conductive trace on the substrate 10 and is electrically connected to the ground plane 102a of the substrate 10 through soldering or the conductive pad such that a shorter noise suppression path is established without any contact with any portion of the shielding case 40. Meanwhile, the noise suppressing structure 60 is electrically connected to the directly grounded part of the substrate 10, which is also disposed closer to the noisy digital/analog IP block 201 and is disposed farther from the vulnerable RF IP block 202.

Figure 4:
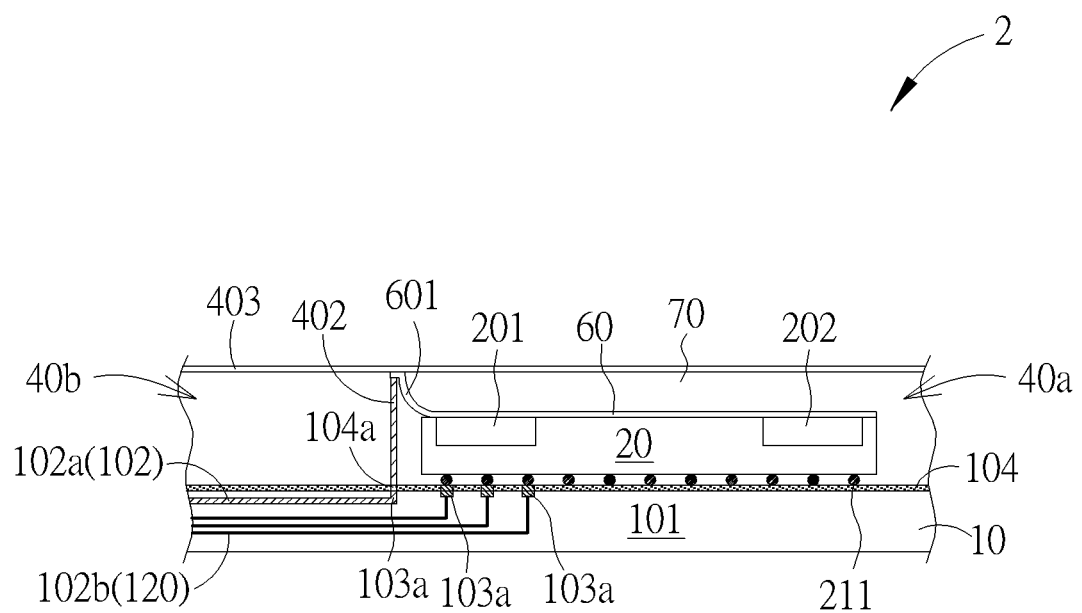
FIG. 4 is a schematic, cross-sectional view of a microelectronic assembly with electromagnetic shielding according to another embodiment of the invention.

Please refer to FIG. 4. FIG. 4 is a schematic, cross-sectional view of a microelectronic assembly with electromagnetic shielding according to another embodiment of the invention, wherein like numeral numbers designate like regions, layer or elements.

As shown in FIG. 4, the difference between the microelectronic assembly 2 in FIG. 4 and the microelectronic assembly 1 in FIG. 1 to FIG. 3 is that the microelectronic assembly 2 in FIG. 4 does not comprise the TIM layer 50. The noise suppressing structure 60 is in direct contact with the first microelectronic component 20. An air gap 70 is provided between the first microelectronic component 20 and the lid 403.

Likewise, the noise suppressing structure 60 may be composed of a flexible or a foldable material capable of suppressing the noise generated by the noisy digital/analog IP block 201 and blocking the noise coupling. According to the illustrative embodiment, for example, the noise suppressing structure 60 may comprise conductive fabric, a copper foil, a metal film, or a copper-plated polyester cloth with an electrically conductive adhesive, but is not limited thereto. According to the illustrative embodiment, the noise suppressing structure 60 may be adhered to the top surface of the first microelectronic component 20.

The noise suppressing structure 60 comprises a connecting portion 601 with its distal end extended and adhered to the intermediate wall 402 such that the noise suppressing structure 60 is electrically coupled to the ground plane 102a of the substrate 10 through the connecting portion 601 and the intermediate wall 402 (a shorter noise suppression path). According to the embodiments, the noise suppressing structure 60 may be electrically coupled to the on-chip and/or off-chip ground.

According to still another embodiment, the shielding case 40 may be composed of a plurality of sidewalls and a lid. According to another embodiment, the intermediate wall 402 in FIG. 4 may be omitted as long as the connecting portion 601 of the noise suppressing structure 60 is electrically connected to a directly grounded part of the plurality of sidewalls of the shielding case 40, which is disposed closer to the noisy digital/analog IP block 201 and is disposed farther from the vulnerable RF IP block 202. The aforesaid directly grounded part of the sidewalls of the shielding case 40 is the part of the sidewalls of the shielding case 40 that is directly connected to the conductive pads 103a and is electrically connected to the ground plane 102a of the substrate 10 such that a shorter noise suppression path is established.

According to another embodiment, the connecting portion 601 of the noise suppressing structure 60 is directly connected to any conductive pads or conductive trace on the substrate 10 and is electrically connected to the ground plane 102a of the substrate 10 through soldering or the conductive pad such that a shorter noise suppression path is established without any contact with any portion of the shielding case 40. Meanwhile, the noise suppressing structure 60 is electrically connected to the directly grounded part of the substrate 10, which is also disposed closer to the noisy digital/analog IP block 201 and is disposed farther from the vulnerable RF IP block 202.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A microelectronic assembly, comprising:
   a substrate;
   a first microelectronic component mounted on the substrate, wherein the first microelectronic component comprises a digital/analog IP block and a RF IP block;
   a second microelectronic component mounted on the substrate, wherein the first microelectronic component and the second microelectronic component are mounted on the substrate in a side-by-side manner;
   a shielding case mounted on the substrate, wherein the shielding case comprises a plurality of sidewalls, one intermediate wall, and a lid, wherein the first microelectronic component and the second microelectronic component are disposed in two separated compartments respectively within the shielding case, and wherein the intermediate wall is interposed between the first microelectronic component and the second microelectronic component;
   a thermal interface material (TIM) layer situated between the lid and the first microelectronic component; and
   a noise suppressing structure interposed between the TIM layer and the first microelectronic component.

2. The microelectronic assembly according to claim 1, wherein the first microelectronic component is mounted on the substrate through a plurality of conductive terminals.

3. The microelectronic assembly according to claim 2, wherein the conductive terminals comprise bumps or solder balls.

4. The microelectronic assembly according to claim 1, wherein the first microelectronic component is a RF System-on-Chip (SoC) or a RF System-in-Package (SiP).

5. The microelectronic assembly according to claim 4, wherein the second microelectronic component is a memory package or an Ethernet circuit.

6. The microelectronic assembly according to claim 1, wherein the digital/analog IP block of the first microelectronic component is closer to the intermediate wall than the RF IP block.

7. The microelectronic assembly according to claim 1, wherein the shielding case is a metal shielding case.

8. The microelectronic assembly according to claim 7, wherein the shielding case is made of copper (Cu) and nickel (Ni).

9. The microelectronic assembly according to claim 1, wherein no slot, aperture, trench or opening is formed in the lid.

10. The microelectronic assembly according to claim 1, wherein the intermediate wall is electrically connected to a ground plane of the substrate through soldering and a conductive pad disposed directly under the intermediate wall.

11. The microelectronic assembly according to claim 10, wherein the noise suppressing structure comprises a connecting portion with its distal end adhered to the intermediate wall such that the noise suppressing structure is electrically coupled to the ground plane of the substrate through the connecting portion and the intermediate wall.

12. The microelectronic assembly according to claim 1, wherein the TIM layer is in direct contact with the lid and the noise suppressing structure.

13. The microelectronic assembly according to claim 12, wherein the noise suppressing structure is in direct contact with the first microelectronic component.

14. The microelectronic assembly according to claim 1, wherein the noise suppressing structure covers entire top surface of the first microelectronic component, and the TIM layer is not in direct contact with the first microelectronic component.

15. The microelectronic assembly according to claim 1, wherein the noise suppressing structure is composed of a flexible material capable of suppressing the noise generated by the digital/analog IP block and blocking noise coupling through the TIM layer and the lid.

16. The microelectronic assembly according to claim 15, wherein the noise suppressing structure comprises conductive fabric, a copper foil, a metal film, or a copper-plated polyester cloth with an electrically conductive adhesive.

17. A microelectronic assembly, comprising:
   a substrate;
   a first microelectronic component mounted on the substrate, wherein the first microelectronic component comprises a digital/analog IP block and a RF IP block;
   a second microelectronic component mounted on the substrate, wherein the first microelectronic component and the second microelectronic component are mounted on the substrate in a side-by-side manner;
   a shielding case mounted on the substrate, wherein the shielding case comprises a plurality of sidewalls and a lid, wherein the first microelectronic component and the second microelectronic component are disposed in two separated compartments respectively within the shielding case;

a thermal interface material (TIM) layer situated between the lid and the first microelectronic component; and a noise suppressing structure interposed between the TIM layer and the first microelectronic component, wherein the noise suppressing structure is electrically connected to a ground plane of the substrate through soldering or a conductive pad.

18. The microelectronic assembly according to claim 17, wherein the noise suppressing structure is electrically connected to a directly grounded part of the plurality of sidewalls of the shielding case, and the noise suppressing structure is disposed closer to the noisy digital/analog IP block than the RF IP block.

19. A microelectronic assembly, comprising:

a substrate;

a first microelectronic component mounted on the substrate, wherein the first microelectronic component comprises a digital/analog IP block and a RF IP block;

a second microelectronic component mounted on the substrate, wherein the first microelectronic component and the second microelectronic component are mounted on the substrate in a side-by-side manner;

a shielding case mounted on the substrate, wherein the shielding case comprises a plurality of sidewalls and a lid, wherein the first microelectronic component and the second microelectronic component are disposed in two separated compartments respectively within the shielding case; and a noise suppressing structure disposed directly on the first microelectronic component.

20. The microelectronic assembly according to claim 19, wherein the noise suppressing structure is in direct contact with the first microelectronic component.

21. The microelectronic assembly according to claim 19 further comprising:

an air gap between the noise suppressing structure and the lid.

* * * * *